(12) United States Patent
Du et al.

(10) Patent No.: US 10,429,979 B2
(45) Date of Patent: Oct. 1, 2019

(54) TOUCH FILM, TOUCH PANEL AND TOUCH DISPLAY DEVICE

(71) Applicant: Shanghai Tianma Micro-Electronics Co., Ltd., Shanghai (CN)

(72) Inventors: Lingxiao Du, Shanghai (CN); Hong Ding, Shanghai (CN); Qing Zhang, Shanghai (CN); Kang Yang, Shanghai (CN); Yang Zeng, Shanghai (CN); Gang Liu, Shanghai (CN); Xuening Liu, Shanghai (CN)

(73) Assignee: SHANGHAI TIANMA MICRO-ELECTRONICS CO., LTD., Shanghai (CN)

( * ) Notice: Subject to any disclaimer, the term of this patent is extended or adjusted under 35 U.S.C. 154(b) by 0 days.

(21) Appl. No.: 15/937,936

(22) Filed: Mar. 28, 2018

(65) Prior Publication Data

US 2019/0187846 A1    Jun. 20, 2019

(30) Foreign Application Priority Data

Dec. 19, 2017    (CN) .......................... 2017 1 1375595

(51) Int. Cl.
| | |
|---|---|
| *G06F 3/041* | (2006.01) |
| *H01L 51/52* | (2006.01) |
| *H01L 21/56* | (2006.01) |
| *G06F 1/16* | (2006.01) |

(52) U.S. Cl.
CPC .......... *G06F 3/0412* (2013.01); *G06F 1/1652* (2013.01); *H01L 21/56* (2013.01); *H01L 51/5203* (2013.01); *G06F 2203/04102* (2013.01)

(58) Field of Classification Search
CPC ..................... G06F 1/1652; G06F 2203/04102
See application file for complete search history.

(56) References Cited

U.S. PATENT DOCUMENTS

| | | | |
|---|---|---|---|
| 2017/0003800 A1* | 1/2017 | Zhu ........................ | G06F 3/0412 |
| 2018/0246603 A1* | 8/2018 | Yu ............................ | G06F 3/047 |

FOREIGN PATENT DOCUMENTS

CN    106201097 A    12/2016

* cited by examiner

*Primary Examiner* — Dong Hui Liang
(74) *Attorney, Agent, or Firm* — Tarolli, Sundheim, Covell & Tummino LLP

(57) ABSTRACT

The present disclosure relates to a touch film, a touch panel, a touch display device and a preparing method thereof, in which breakage probability in a metal portion can be reduced, thereby improving the touch performance. The touch film comprises a flexible substrate made of polyimide, a metal layer, and an organic film arranged therebetween and having a water drop contact angle less than 80°. The touch film further comprises a touch electrode layer comprising multiple groups of first touch electrodes and multiple groups of second touch electrodes, wherein each group of the first touch electrodes comprises a plurality of first touch electrodes arrayed in a second direction; and each group of the second touch electrodes comprises a plurality of second touch electrodes arrayed in a first direction. The metal layer comprises metal connection lines for electrically connecting adjacent first touch electrodes.

12 Claims, 8 Drawing Sheets

TOUCH FILM, TOUCH PANEL AND TOUCH DISPLAY DEVICE

CROSS-REFERENCE TO RELATED APPLICATIONS

The present application claims priority to Chinese Patent Application No. 201711375595.9, filed on Dec. 19, 2017, the content of which is incorporated herein by reference in its entirety.

TECHNICAL FIELD

The present disclosure relates to the field of touch, in particular, to a touch film, a touch panel and a touch display device.

BACKGROUND

With continuous development of the touch sensing technology in recent years, mobile phones, tablet computers and numerous other display devices are provided with touch panels. Currently, common touch panels include resistive touch panels, capacitive touch panels, optical touch panels and the like. In the related art, a touch sensing electrode and a touch driving electrode in a mutual-capacitive touch structure made of indium tin oxide (ITO) material are arranged on the same layer, and touch electrodes in the same row or in the same column need a metal bridge structure for electric connection. Meanwhile, a metal grid has the advantages of higher conductivity, lower price and the like, and thus may be used as an alternative to the touch electrode made of the ITO material.

In order to overcome the above defect, the touch electrode prepared on a flexible substrate made of a cycloolefin copolymer (COP) is known in the related art. However, as COP is relatively hard, only the requirement on a display device with a fixed curvature can be met at present, but requirements of a flexible display apparatus that can be bent or curled cannot be met. To further improve the flexibility of the touch panel, it is known in the prior art that the touch electrode is prepared on a flexible substrate made of polyimide (PI). Polyimide is more flexible, thereby meeting the requirements of the flexible display apparatus that can be bent or curled.

However, when the touch electrode is prepared on the flexible substrate made of PI material, a metal portion of the touch electrode is likely to break during the use of a display device, particularly, a flexible display device due to different deformation rates of the metal portion and the organic material in the touch electrode, adversely affecting the touch performance.

SUMMARY

In view of this, embodiments of the present disclosure provide a touch film, a touch panel and a touch display device. In the present disclosure, a line breakage probability at a metal portion can be reduced, and thus the touch performance is improved.

According to a first aspect, the embodiments of the present disclosure provide a touch film, including a flexible substrate, wherein the material of the flexible substrate is polyimide; a metal layer; an organic film arranged between the metal layer and the flexible substrate, wherein a water drop contact angle of the organic film is less than 80°; and a touch electrode layer, the touch electrode layer including multiple groups of first touch electrodes and multiple groups of second touch electrodes. The multiple groups of first touch electrodes are arranged in a first direction and extend along a second direction, and the multiple groups of second touch electrodes are arrayed in the second direction and extend along the first direction. Each group of the first touch electrodes includes a plurality of first touch electrodes arrayed in the second direction, and each group of the second touch electrodes includes a plurality of second touch electrodes arrayed in the first direction. In each group of the second touch electrodes, the adjacent second touch electrodes are electrically coupled. The metal layer includes metal connection lines. In each group of the first touch electrodes, the adjacent first touch electrodes are electrically coupled through the corresponding metal connection line. An insulating layer is arranged between the metal connection lines and the second touch electrodes.

According to a second aspect, the embodiments of the present disclosure further provide a touch film, including a flexible substrate, wherein the material of the flexible substrate is polyimide; a metal layer; and an organic film is arranged between the metal layer and the flexible substrate, wherein a water drop contact angle of the organic film is less than 80°. The metal layer includes a first metal layer, a second metal layer, and an insulating layer located between the first metal layer and the second metal layer, wherein the first metal layer is located between the insulating layer and the organic film. The first metal layer includes a plurality of first touch electrodes, the first touch electrodes being arrayed in a first direction and extending along a second direction. The second metal layer includes a plurality of second touch electrodes, the second touch electrodes being arrayed in the second direction and extending along the first direction. Each of the first touch electrodes and each of the second touch electrodes have a grid-like structure formed by metal grid lines.

According to a third aspect, the embodiments of the present disclosure further provide a touch panel, including a flexible display panel and the touch film according to the first or second aspect, wherein the flexible display panel includes a flexible base and a display film arranged on the flexible base; and the touch film is arranged on the side of the display film away from the flexible base.

According to a fourth aspect, the embodiments of the present disclosure further provide a touch display device, including the touch panel according to the third aspect of the present disclosure.

According to the touch film, the touch panel and the touch display device provided by the embodiments of the present disclosure, the organic film is arranged between the metal layer and the flexible substrate in the touch film; and the overpass connection of the touch electrodes is realized through the metal lines in the metal layer. On one hand, as the water drop contact angle of the organic film is less than 80°, the etching effect of the metal lines can be improved compared with the related art in which metal lines are directly prepared on a flexible substrate made of a PI material, so that the breakage resistance of the metal lines is improved, i.e., the breakage probability of the metal lines is reduced, thereby enhancing the touch performance. On the other hand, when the organic material as the film between the flexible substrate and the metal layer is compared with an inorganic material as the film between the flexible substrate and the metal layer in the related art, the organic material is more conducive to the improvement of the line breakage resistance of the metal layer, i.e., the breakage probability of the metal lines is further reduced, thereby further enhancing the touch performance.

DESCRIPTION OF EMBODIMENTS

The present disclosure will be further described below in combination with the specific embodiments. It should be understood that these embodiments are only configured to illustrate the present disclosure, instead of limiting the scope of the present disclosure.

Figure 1:
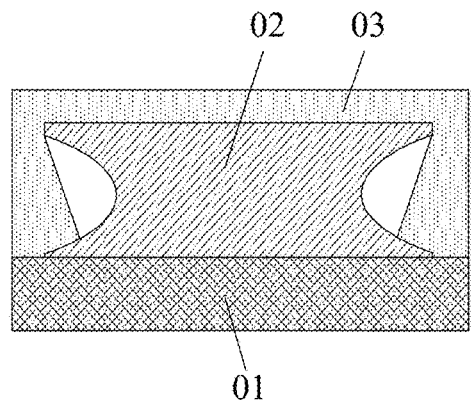
FIG. 1 is a schematically sectional view of a structure after metal is formed on a flexible substrate in the related art.
Figure 2:
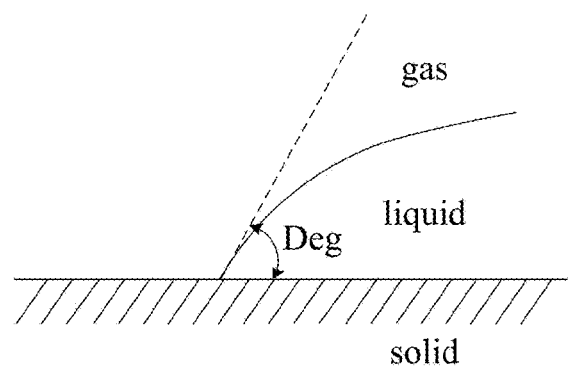
FIG. 2 is a schematic view illustrating a water drop contact angle.

To describe the technical effects of the embodiments of the present disclosure more clearly, before describing the embodiments of the present disclosure, the technical problems in the related art will be described first. In the related art, a touch electrode is prepared on a flexible substrate made of a PI material, wherein a metal portion of the touch electrode is adjacent to the flexible substrate. The inventor finds that, the metal portion tends to break, especially in a foldable or bendable display device, thereby adversely affecting the touch performance. On basis of above, the inventor further finds that the higher breakage probability of the metal portion is related to a manufacturing process. Referring to FIG. 1, FIG. 1 is a schematically sectional view of a structure after metal is formed on a flexible substrate in the related art. In the manufacturing process, a flexible substrate 01 made of a PI material is firstly prepared; then, a metal layer is formed on the flexible substrate 01; and the metal layer is patterned through a patterning process. In the patterning process, the metal layer is etched through an etching solution to etch away unnecessary portions in the metal layer, so as to remain the required metal layer 02. In the etching process, the etching solution may fall onto the flexible substrate 01; the etching solution on the flexible substrate 01 has a larger water drop contact angle. The larger the water drop contact angle is, the slower the flowing speed of the etching solution is, and thus the etching effect is poorer. The poor etching effect results in that, the edge of the metal layer 02 should be further etched by the etching solution to form a structure as shown in FIG. 1. In this structure, lines in a pattern formed by the metal layer 02 are thinner, and the edges of the metal layer 02 have groove-like structures. After the etching of the metal layer 02 is completed, an insulating layer 03 is prepared on the side of the metal layer 02 away from the flexible substrate 01. The edges of the metal layer 02 may not be fully filled and covered with the insulating layer 03 due to the groove-like structure on the edges of the metal layer 02. Thus, the lines in the pattern of the metal layer 02 are likely to break. Referring to FIG. 2, FIG. 2 is a schematic view illustrating a water drop contact angle. The water drop contact angle Deg is an angle at an interface where solid phase, liquid phase and gas phase merge, or an angle at an interface where gas phase and liquid phase merge, or an angle at an interface where solid phase and liquid phase merge. The inventor further finds that, the water drop contact angle Deg is related to the hydrophilicity of a solid material in contact with the water drop. Different materials have different hydrophilicities, so that the etching effects of metals prepared on films made of different materials are different, and thus the metals have different line breakage resistances.

TABLE I

| X | Y | PI | Inorganic Deg | Organic |
|---|---|---|---|---|
| 650 | 500 | 83.5 | 51.2 | 73.7 |
| 216.7 | 500 | 80.7 | 51.9 | 74.5 |
| −216.7 | 500 | 81.9 | 52.1 | 74.9 |
| −650 | 500 | 82.1 | 52.8 | 75.1 |
| −650 | 166.7 | 80.7 | 52.5 | 73.7 |
| −216.7 | 166.7 | 81.6 | 51.9 | 74.6 |
| 216.7 | 166.7 | 82.3 | 51.7 | 75.3 |
| 650 | 166.7 | 82.5 | 50.5 | 75.1 |
| 650 | −166.7 | 81.1 | 52.8 | 75.2 |
| 216.7 | −166.7 | 81.8 | 51.9 | 75 |
| −216.7 | −166.7 | 80.5 | 51.2 | 74.5 |
| −650 | −166.7 | 81.1 | 50.9 | 74.9 |
| −650 | −500 | 81.9 | 51.8 | 75.2 |
| −216.7 | −500 | 81.1 | 52.5 | 75.1 |
| 216.7 | −500 | 81.3 | 51.8 | 75.3 |
| 650 | −500 | 81 | 51.9 | 74.2 |

Referring to Table I, the water drop contact angles of three different materials at different positions are compared in Table I. In Table I, the first column shows X-axis coordinate values of test positions; the second column shows Y-axis coordinate values of the test positions; the third column shows water drop contact angles Deg at the corresponding positions on the PI material; the fourth column shows water drop contact angles Deg at the corresponding positions on an inorganic material; and the fifth column shows water drop contact angles Deg at the corresponding positions on an organic material. It can be seen from Table I that the water drop contact angle Deg depends on a material where the liquid is located, wherein the water drop contact angle Deg corresponding to the PI material is about 81°; the water drop contact angle Deg corresponding to the inorganic material is about 51°; and the water drop contact angle Deg corresponding to the organic material is about 75°. Therefore, the inventor finds that the problem of metal breakage can be solved, if the film between the flexible substrate and the metal layer is made of an organic material or an inorganic material having the water drop contact angles Deg less than 80°. On this basis, the inventor further finds that compared with a metal prepared on the film made of the inorganic material, a metal formed on the film made of the organic material has lower probability of the breakage. The detailed description is as follows.

Figure 3:
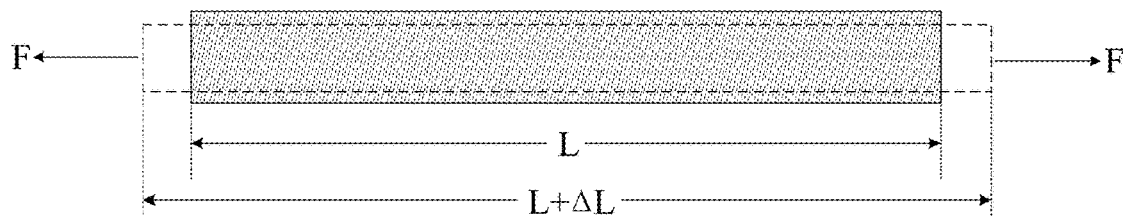
FIG. 3 is a schematic view illustrating a state when a film is subjected to a tensile force.
Figure 4:
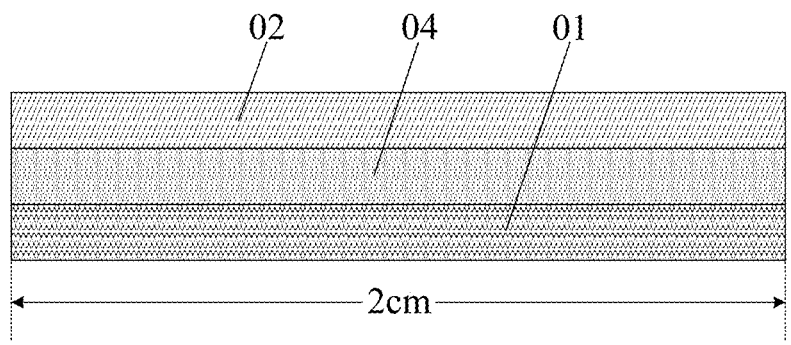
FIG. 4 is a schematic view of a film structure in which an inorganic layer is arranged between a flexible substrate and a metal layer.
Figure 5:
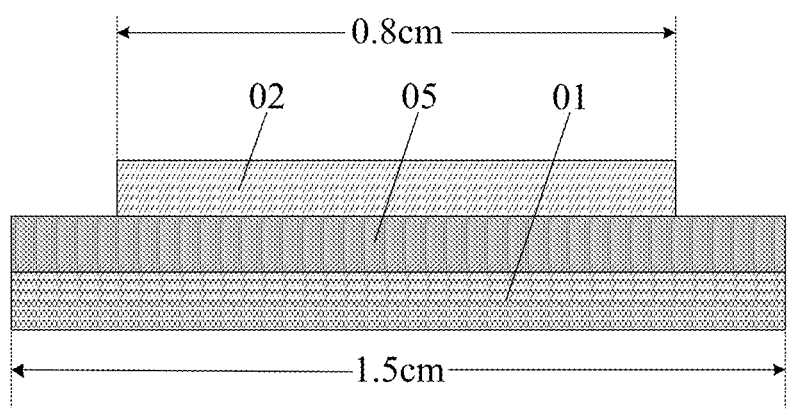
FIG. 5 is a schematic view of a structure of a film structure in which an organic layer is arranged between the flexible substrate and the metal layer.

Referring to FIG. 3, FIG. 3 is a schematic view showing a state when a film is subjected to a tensile force. A rectangle filled with shadow pattern in FIG. 3 shows the structure of the film not subjected to the tensile force. A dashed rectangle unfilled with shadow pattern shown with dotted line in FIG. 3 is the structure of the film which is deformed under tensile forces F from two sides. Under the tensile force F, the film is deformed, and a deformation amount is defined as $\Delta L/L$, wherein L represents an original length of the film when no tensile force is applied onto; and $\Delta L$ represents an elongation of the film when it is subjected to the tensile force. Here, $\Delta L=(F\times L)/(E\times A)$, wherein A indicates a cross section area of the film; E indicates an elasticity modulus of the film; and F indicates the tensile force applied onto the film. Further, the deformation value is defined as $\Delta L/L=F/(E*A)$, wherein A=thickness of the film×width of the film; and the deformation amount depends on the tensile force, the elasticity modulus and the cross section area. Referring to FIGS. 4-5, FIG. 4 is a schematic view of a film structure in which an inorganic layer is arranged between a flexible substrate and a metal layer; and FIG. 5 is a schematic view of a film structure in which an organic layer is arranged between a flexible substrate and a metal layer. The film structure shown in FIG. 4 includes a flexible substrate 01, a metal layer 02, and an inorganic layer 04 between the flexible substrate 01 and the metal layer 02. The film structure shown in FIG. 5 includes a flexible substrate 01, a metal layer 02, and an organic layer 05 between the flexible substrate 01 and the metal layer 02. Table II shows parameters of each film in FIGS. 4 and 5.

TABLE II

| | | Parameters of Each Film | | |
|---|---|---|---|---|
| | Film | Material | Thickness (um) | Elasticity Modulus ×10⁹ | Width (cm) |
| FIG. 4 | Flexible Substrate 01 | PI | 10 | 6.2 | 2 |
| | Inorganic Layer 04 | SiNx | 0.25 | 314 | 2 |
| | | SiOx | 0.1 | 70 | 2 |
| | Metal Layer 02 | Mo | 0.03 | 330 | 2 |
| | | AlNd | 0.2 | 69 | 2 |
| | | Mo | 0.13 | 330 | 2 |
| FIG. 5 | Flexible Substrate 01 | PI | 10 | 6.2 | 1.5 |
| | Organic Layer 05 | Organic Material | 1.5 | 3 | 1.5 |
| | Metal Layer 02 | Mo | 0.03 | 330 | 0.8 |
| | | AlNd | 0.2 | 69 | 0.8 |
| | | Mo | 0.13 | 330 | 0.8 |

As shown in Table II, in the film structures shown in FIGS. 4 and 5, each metal layer is formed by stacking three metal portions, and the three metal portions are Mo, AlNd and Mo sequentially, wherein the inorganic layer is formed by stacking SiNx and SiOx. Practical tensile tests are performed on three samples formed according to the film structures shown in FIG. 4, and also performed on two samples formed according to the film structures shown in FIG. 5. The test results are shown in Table III.

TABLE III

| Tested Sample | | Corresponding Tensile Force When Metal Layer Is Broken | Deformation Amount |
|---|---|---|---|
| FIG. 4 | Sample 1 | 17.7N | 4.13‰ |
| | Sample 2 | 15.3N | 3.57‰ |
| | Sample 3 | 16.6N | 3.877‰ |
| FIG. 5 | Sample 4 | 13.4N | 8.363‰ |
| | Sample 5 | 13.26N | 8.276‰ |

As shown in Table III, the deformation amount when the metal layers of the film structures according to FIG. 5 are broken are almost twice as great as those when the metal layer of the film structures according to FIG. 4 are broken. That is, compared with the metal layer of the film structures according to FIG. 4, the breakage probability of the metal layer of the film structures according to FIG. 5 is lower. Therefore, based on the comparison of the organic material and the inorganic material which respectively serve as the film between the flexible substrate and the metal layer, it is known that compared with the inorganic material, the organic material can improve the breakage resistance of the metal layer.

In summary, the organic material having the water drop contact angle less than 80° is selected as the film between the flexible substrate and the metal layer. On one hand, the water drop contact angle on the organic material is smaller than that on PI, so that the etching effects on metal layer can be improved, thereby enhancing the breakage resistance of the metal layer. On the other hand, when comparing the organic material as the film between the flexible substrate and the metal layer with the inorganic material as the film between the flexible substrate and the metal layer, the organic material is more advantageous to improve the breakage resistance of the metal layer better. The embodiments using an organic material as a film between a flexible substrate and a metal layer are described in detail below.

Figure 6:
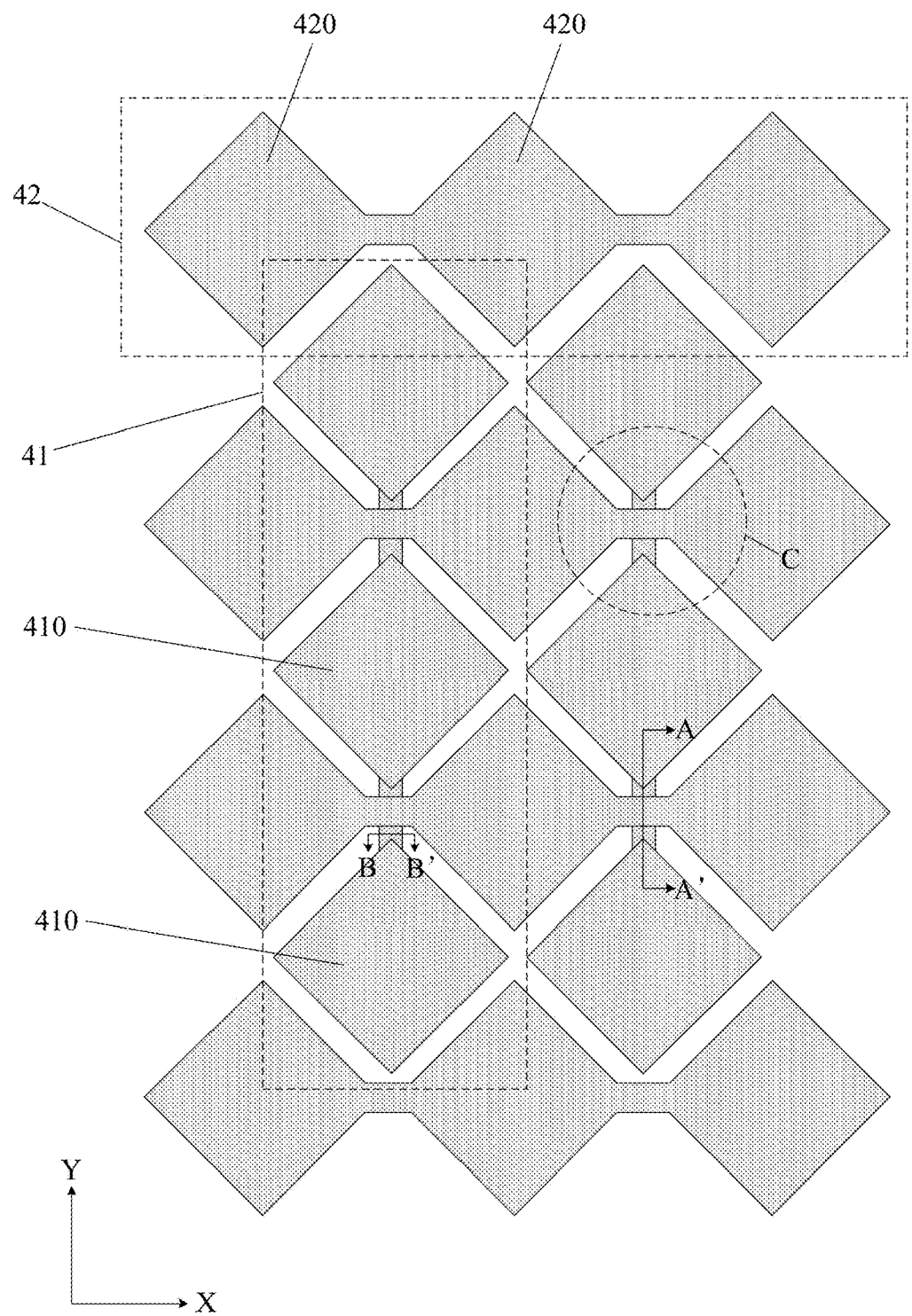
FIG. 6 is a schematically structural view of a partial region of a touch film according to an embodiment of the present disclosure.
Figure 7:
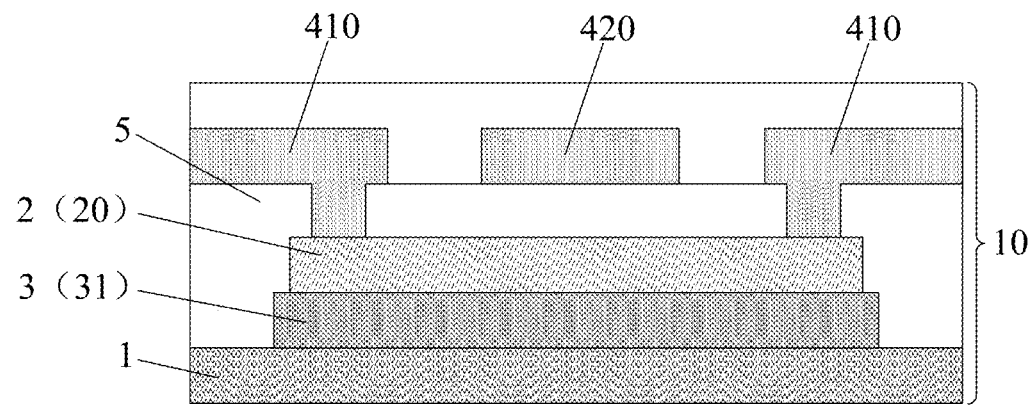
FIG. 7 is a schematically sectional view along the AA' direction in FIG. 6.

Referring to FIGS. 6-7, FIG. 6 is a schematically structural view of a partial region of a touch film according to an embodiment of the present disclosure; and FIG. 7 is a schematically sectional structure view along the AA' direction in FIG. 6. The embodiments of the present disclosure provide a touch film 10, including a flexible substrate 1 and a metal layer 2, wherein the material of the flexible substrate 1 is polyimide; an organic film 3 is arranged between the metal layer 2 and the flexible substrate 1; and a water drop contact angle of the organic film 3 is less than 80°. The touch film 10 further includes a touch electrode layer 4, wherein the touch electrode layer 4 includes multiple groups of first touch electrodes 41 and multiple groups of second touch electrodes 42. The multiple groups of first touch electrodes 41 are arrayed in a first direction Y and extend along a second direction X, while the multiple groups of second touch electrodes 42 are arrayed in the second direction X and extend along the first direction Y. Each group of the first touch electrodes 41 includes a plurality of first touch electrodes 410 arrayed in the second direction X. Each group of the second touch electrodes 42 includes a plurality of second touch electrodes 420 arrayed in the first direction Y, wherein the adjacent second touch electrodes 420 in each group of the second touch electrodes 42 are electrically coupled with one another. The metal layer 2 includes metal connection lines 20. In each group of the first touch electrodes 41, the adjacent first touch electrodes 410 are electrically coupled with one another through the corresponding metal connection line 20; and an insulating layer 5 is arranged between the metal connection lines 20 and the second touch electrodes 420.

Figure 8:
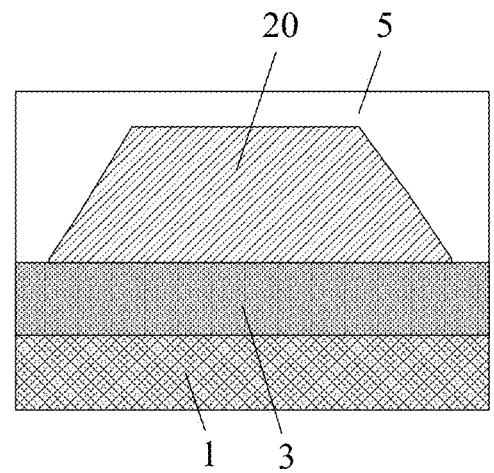
FIG. 8 is a schematically sectional view along the BB' direction in FIG. 6.
Figure 9:
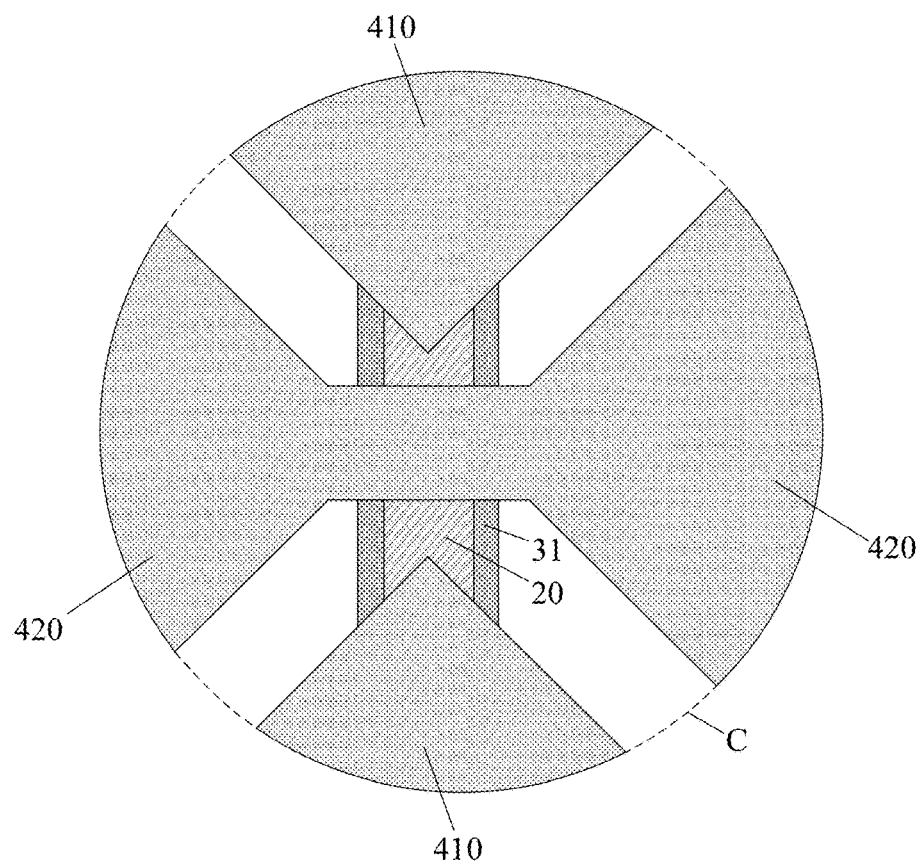
FIG. 9 is a schematically partially enlarged view at the portion C in FIG. 6.

The flexible substrate 1 is configured to enable the touch film 10 to be bent or curled. The organic film 3 is configured to allow the metal layer 2 to be prepared thereon. The metal layer 2 is configured to form the metal connection lines 20. The first touch electrodes 410 and the second touch electrodes 420 are located on the same layer. In each group of the second touch electrodes 42, the adjacent second touch electrodes 420 are electrically coupled. For example, as shown in FIGS. 6 and 7, the adjacent second touch electrodes 420 are directly connected through the material on the same layer. Other connecting manners are also possible. As the second touch electrodes 420 are connected with one another on the same layer or for other reasons, the first touch electrodes 410 need to be electrically coupled through metal bridges disposed on another layer. The metal connection lines 20 in the metal layer 2 may serve as metal bridges for electrically connecting the first touch electrodes 410. One end of each connection line 20 is connected to one first touch electrode 410 via a through-hole in the insulating layer 5, and the other end of each connection line 20 is connected to another first touch electrode 410 via another through-hole in the insulating layer 5, so that the two adjacent first touch electrodes 410 in the same group of the first touch electrodes 41 are electrically coupled. The first touch electrodes 410 are driving electrodes and the second touch electrodes 420 are sensing electrodes, or the second touch electrodes 420 are sensing electrodes and the first touch electrodes 410 are driving electrodes. When the touch is functioning, driving signals are output to the driving electrodes, and the sensing electrodes can generate corresponding sensing signals according to the change of a driving signal line. The sensing signals are received from the sensing electrodes. When there is a touch operation, the sensing signal at the corresponding position is changed by capacitive coupling, and the touch position can be recognized according to the change of the sensing signals, so as to realize the touch function. The metal connection lines 20 are configured to realize overpass connection between the touch electrodes. Since the metal connecting lines 20 are opaque and the touch film 10 is usually arranged at the display region of the display panel to realize a touch display function, the metal connection lines 20 are thin enough to avoid adverse effect on the display. Referring to FIG. 8, FIG. 8 is a schematically sectional structure view along the BB' direction in FIG. 6. Compared with FIG. 1, it can be seen that in FIG. 8, when the metal connection lines 20 are prepared on the organic material having a smaller water drop contact angel, the etching effect is better due to the higher flowing speed of an etching solution. No groove-like structure is formed at the edges of the metal connection lines 20, so that the insulating layer 5 can fully cover the edges of the metal connection lines 20. Therefore, the metal connection lines 20 prepared on the organic material having the water drop contact angel less than 80° are relatively unlikely to break.

With respect to the touch film provided by the embodiments of the present disclosure, the organic film is arranged between the metal layer and the flexible substrate, and the overpass connection of the touch electrodes is realized through the metal connection lines in the metal layer. On one hand, as the water drop contact angle of the organic film is less than 80°, the etching effect of the metal connection lines can be improved compared with the related art in which metal overpasses are directly prepared on a flexible substrate made of PI material, thereby improving the breakage resistance of the metal connection lines, i.e., the breakage probability of the metal connection lines is reduced, thereby enhancing the touch performance. On the other hand, when the organic material as the film between the flexible substrate and the metal layer is compared with an inorganic material as the film between the flexible substrate and the metal layer in the related art, the organic material is more conducive to the improvement of the breakage resistance of the metal layer, i.e., the breakage probability of the metal connection lines is further reduced, thereby further enhancing the touch performance.

In an embodiment, the first touch electrodes 410 and the second touch electrodes 420 are made of an indium tin oxide material.

The indium tin oxide material is a transparent conductive material. On one hand, this material can be used as a touch electrode; and on the other hand, the material has less influence on display due to its high light transmittance.

In an embodiment, the material of the organic film 3 is selected form a group consisting of epoxy resin, phenolic resin, acrylic resin and methacrylic resin and combinations thereof.

In this embodiment, all of the above materials are organic materials having water drop contact angles less than 80°.

In an embodiment, the light transmittance of the organic film 3 is greater than 95%.

In this embodiment, the light transmittance of the organic film 3 is larger, so that the influence on display is less.

In an embodiment, as shown in FIG. 2, the above water drop contact angle indicates an angle at an interface where solid phase, liquid phase and gas phase merge, or an angle at an interface where gas phase and liquid phase merge, or an angle at an interface where solid phase and liquid phase merge.

In an embodiment, as shown in FIG. 8, in a cross section along a direction perpendicular to the flexible substrate 1, width of the metal connection lines 20 gradually decreases in a direction away from the flexible substrate 1.

In this embodiment, when the metal connection lines 20 are prepared on an organic material (the organic film 3) with a smaller water drop contact angel, the etching effect is better due to the higher flowing speed of an etching solution. The cross section of the metal connection lines 20 is trapezoidal, and the width of the trapezoid is gradually decreased in a direction away from the flexible substrate 1. After the patterning of the metal connection lines 20 is completed, the insulating layer 5 is prepared on the film on which the metal connection lines 20 are formed. No groove-like structure are formed at the edge of the metal connection lines 20, so that the insulating layer 5 can fully cover the edge of the metal connection lines 20, leading to a better coating effect on the metal connection line 20. Thus, the overall film structure is more stable, and the metal connection lines 20 can be better protected. Therefore, the metal connection lines 20 prepared on the organic material having the water drop contact angel less than 80° are unlikely to break.

Figure 10:
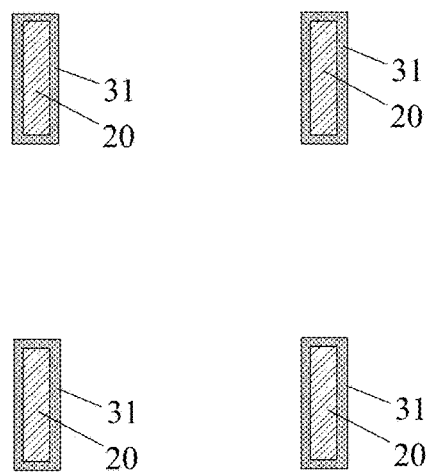
FIG. 10 is a schematically structural view of a portion only comprising metal connection lines and connection line disposing portions.

Referring to FIGS. 6-7 and FIGS. 9-10, FIG. 9 is a schematically partial enlarged view at the portion C in FIG. 6, and FIG. 10 is a schematically structural view of a portion only comprising metal connection lines and connection line disposing portions. In this embodiment, the organic film 3 includes a plurality of connection line disposing portions 31. An orthogonal projection of each metal connection line 20 on the flexible substrate 1 falls into a region of an orthogonal projection region of each connection line disposing portion 31 on the flexible substrate 1.

In this embodiment, instead of providing a continuous organic film 3 on the whole surface, the organic film 3 is patterned with the connection line disposing portions 31 corresponding to each of the metal connection lines 20, respectively. The connection line disposing portions 31 are only provided at positions corresponding to the metal connection lines 20, so that the metal connection lines 20 are formed on the connection line disposing portions 31 made of an organic material having a water drop contact angle less than 80°. In this way, the breakage probability of the metal connection lines 20 is reduced, improving the touch performance, and meanwhile, the influence of the organic film 3 on the display transmittance is reduced to the greatest extent.

Figure 11:
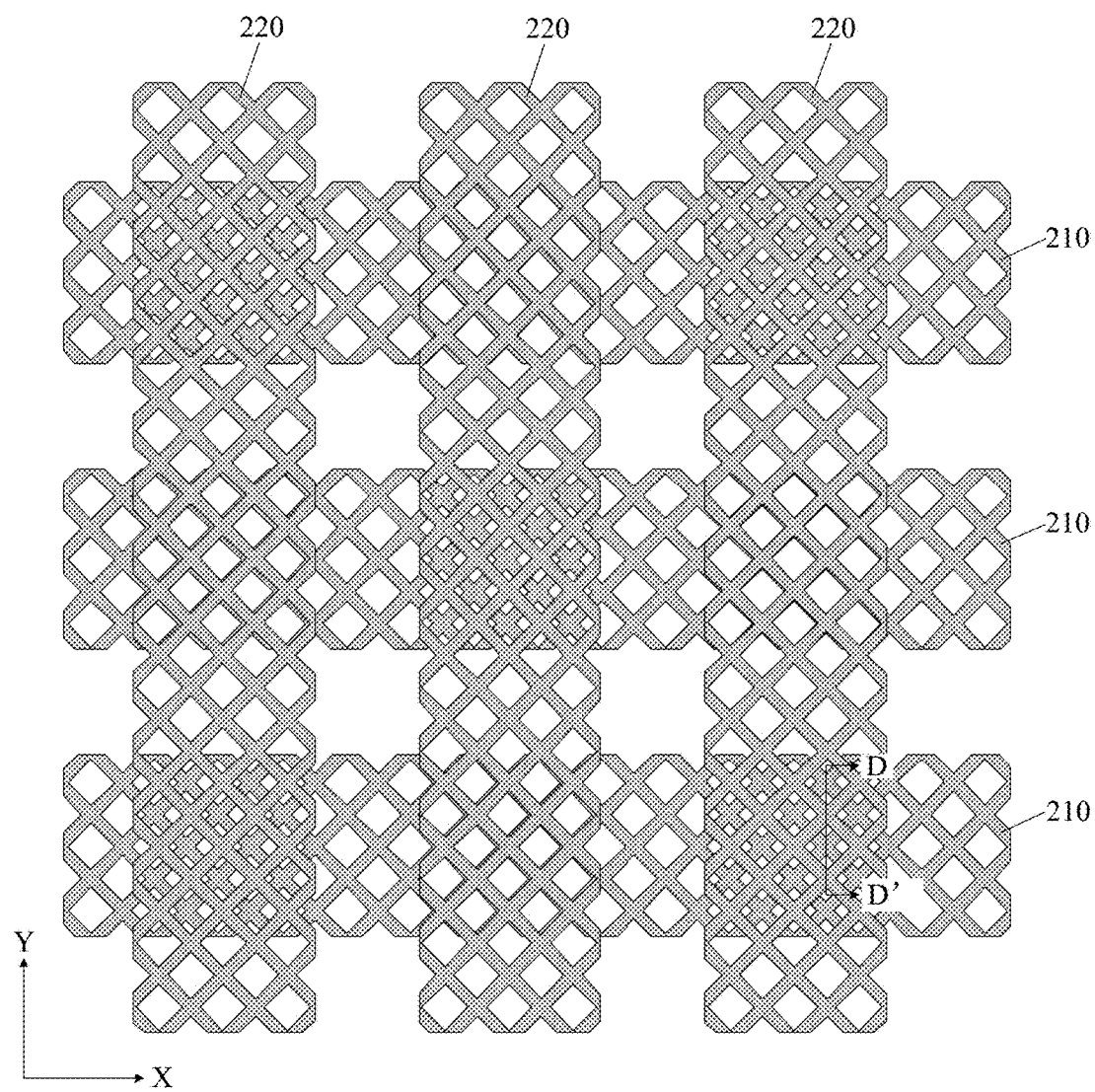
FIG. 11 is a schematically structural view of another touch film according to an embodiment of the present disclosure.
Figure 12:
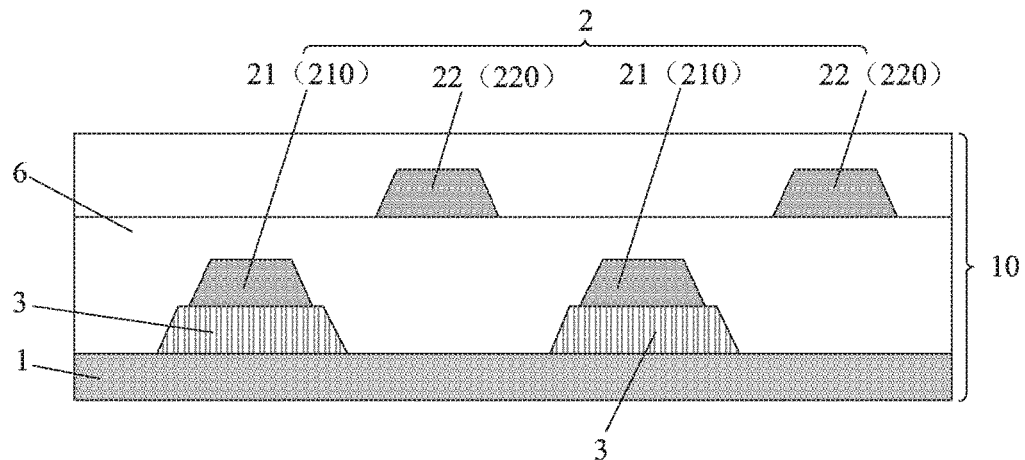
FIG. 12 is a schematically sectional view along the DD' direction in FIG. 11.

Referring to FIGS. 11-12, FIG. 11 is a schematically structural view of another touch film according to an embodiment of the present disclosure, and FIG. 12 is a schematically sectional structure view along the DD' direction in FIG. 11. This embodiment of the present disclosure further provides a touch film 10, including a flexible substrate 1 and a metal layer 2, wherein the material of the flexible substrate 1 is polyimide; an organic film 3 is arranged between the metal layer 2 and the flexible substrate 1; and a water drop contact angle of the organic film 3 is less than 80°. The metal layer 2 includes a first metal layer 21, a second metal layer 22, and an insulating layer 6 located between the first metal layer 21 and the second metal layer 22, wherein the first metal layer 21 is located between the insulating layer 6 and the organic film 3. The first metal layer 21 includes a plurality of first touch electrodes 210, the first touch electrodes 210 being arrayed in a first direction Y and extending along a second direction X. The second metal layer 22 includes a plurality of second touch electrodes 220, the second touch electrodes 220 being arrayed in the second direction X and extending along the first direction Y. Each first touch electrode 210 or each the second touch electrode 220 is of a grid-like structure formed by metal grid lines.

The principle of the touch film according to this embodiment is the same as the touch film is formed by using the touch electrodes made of the indium tin oxide material, which is not described in detail herein. The difference is that, in this embodiment, the touch electrodes are made of a metal material. In order to avoid the influence of the metal material on the display transmittance, touch electrodes are made into a grid-like structure. However, the grid-like structure of the touch electrode leads to the breakage probability of the metal grid lines in the grid-like structure. Therefore, in this embodiment, the organic film 3 arranged between the metal layer 2 and the flexible substrate 1 is also configured to solve the problem of high breakage probability of the metal portion.

In the touch film provided by the present embodiment, the organic film is provided between the metal layer and the flexible substrate, and the metal layer is configured to prepare touch electrodes having metal grid lines. On one hand, as the water drop contact angle of the organic film is less than 80°, the etching effect of the metal grid lines can be improved compared with the related art in which metal grid lines are directly prepared on a flexible substrate made of a PI material. Thus, the breakage resistance of the metal grid lines is improved, i.e., the breakage probability of the metal grid lines is reduced, thereby enhancing the touch performance. On the other hand, when the organic material as the film between the flexible substrate and the metal layer is compared with the inorganic material as the film between the flexible substrate and the metal layer in the related art, the organic material is more conducive to the improvement of the breakage resistance of the metal layer, i.e., the breakage probability of the metal grid lines is further reduced, thereby further enhancing the touch performance.

In an embodiment, in a cross section along a direction perpendicular to the flexible substrate 1, width of the metal grid lines is gradually decreased in a direction away from the flexible substrate 1.

In this embodiment, when the metal grid lines are prepared on an organic material (the organic film 3) with a smaller water drop contact angel, the etching effect is better due to the higher flowing speed of an etching solution. The cross section of the metal grid lines is trapezoidal, and the width of the trapezoid is gradually decreased in a direction away from the flexible substrate 1. After the patterning of the metal grid lines is completed, an insulating layer 6 is prepared on the film on which the metal grid lines are formed. No groove-like structure at the edges of the metal grid lines, so that the insulating layer 6 can fully cover the edge of the metal grid lines, achieving better coating effect on the metal grid lines. Thus, the overall film structure is more stable, and the metal grid lines can be better protected. Therefore, the metal grid lines prepared on the organic material having the water drop contact angel less than 80° are unlikely to break.

In an embodiment, the organic film 3 includes a plurality of grid line disposing portions. An orthogonal projection of each first touch electrode 210 on the flexible substrate 1 fall within a region of an orthogonal projection region of each grid line disposing portion 31 on the flexible substrate 1.

In this embodiment, instead of providing a continuous organic film 3 on the whole surface, the organic film 3 is patterned into the grid line disposing portions corresponding to each of the first touch electrodes 210, respectively. The grid line disposing portions are only provided at positions corresponding to the metal grid lines, so that the metal grid lines are formed on the grid line disposing portions made of an organic material having a water drop contact angle less than 80°. In this way, the breakage probability of the metal grid lines is reduced, thereby enhancing the touch performance, and meanwhile, the influence of the organic film 3 on the display transmittance is reduced to the greatest extent.

In an embodiment, the material of the organic film 3 is selected from a group consisting of epoxy resin, phenolic resin, acrylic resin and methacrylic resin, and a combination thereof.

In this embodiment, all of the above materials are organic materials with water drop contact angles less than 80°.

In an embodiment, the light transmittance of the organic film 3 is greater than 95%.

In this embodiment, the light transmittance of the organic film 3 is larger, so that the influence on display is less.

In an embodiment, the insulating layer 6 is made of an organic material.

In this embodiment, the insulating layer 6 may also be made of an organic material having water drop contact angle less than 80°. Thus, the breakage probability of the metal grid lines in the first touch electrodes 210 is reduced, so does the breakage probability of the metal grid lines in second touch electrodes 220.

Figure 13:
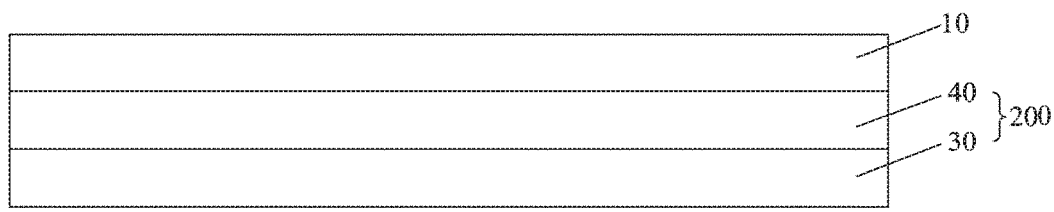
FIG. 13 is a schematically sectional view of a touch panel according to an embodiment of the present disclosure.

Referring to FIG. 13, FIG. 13 is a schematically sectional structure view of a touch panel according to an embodiment of the present disclosure. The present embodiment of the present disclosure further provides a touch panel, including a flexible display panel 200 and the touch film 10 provided in any of the above embodiments. The flexible display panel 200 includes a flexible base 30 and a display film 40 arranged on the flexible substrate 30. The touch film 10 is arranged on the side of the display film 40 away from the flexible substrate 30.

In this embodiment, the flexible display panel 200 is configured to realize flexible display, wherein the display film 40 is configured to provide a display function, the flexible base 30 is configured to provide flexible support for the display film 40, and the touch film 10 is configured to provide a touch function.

It should be noted that the specific structure and principle of the touch film 10 are the same as those of the touch films described in the above embodiments, and details are not repeated herein.

According to the touch panel provided by the embodiment of the present disclosure, the organic film is arranged between the metal layer and the flexible substrate; and the overpass connection of the touch electrodes is realized through the metal lines in the metal layer. On one hand, as the water drop contact angle of the organic film is less than 80°, the etching effect of the metal lines can be improved compared with the related art in which metal lines are directly prepared on a flexible substrate made of a PI material, so that the breakage resistance of the metal lines is improved, i.e., the breakage probability of the metal lines is reduced, thereby enhancing the touch performance. On the other hand, when the organic material as the film between the flexible substrate and the metal layer is compared with the inorganic material as the film between the flexible substrate and the metal layer in the related art, the organic material is more conducive to the improvement of the breakage resistance of the metal line, i.e., the breakage probability of the metal lines is further reduced, thereby further enhancing the touch performance.

Figure 14:
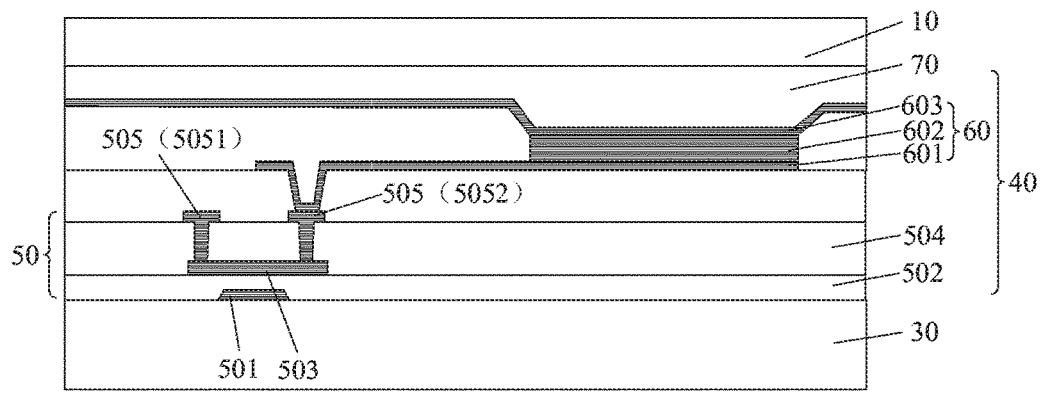
FIG. 14 is a schematically sectional view of a partial structure of another touch panel according to an embodiment of the present disclosure.

Referring to FIG. 14, FIG. 14 is a schematically sectional view of a partial structure of another touch panel according to an embodiment of the present disclosure. In this embodiment, a display film 40 includes a driving film 50, a light-emitting film 60 and an encapsulation film 70. The driving film 50 is electrically coupled to the light-emitting film 60, and drives the light-emitting film 60 to emit light. The encapsulation film 70 is configured to encapsulate the driving film 50 and the light-emitting film 60.

In an embodiment, the driving film 50 includes a grid electrode layer 501 arranged on the flexible base 30, a first insulating layer 502 covering the grid electrode layer 501 and the flexible base 30, an active layer 503 arranged on the side of the first insulating layer 502 away from the grid electrode layer 501, a second insulating layer 504 covering the active layer 503, and a source-drain electrode layer 505 arranged on the side of the active layer 503 away from the flexible base 30. The source-drain electrode layer 505 includes a source electrode 5051 and a drain electrode 5052, the source electrode 5051 and the drain electrode 5052 being electrically coupled to the active layer 503.

In an embodiment, the light-emitting film 60 includes an anode layer 601 electrically coupled to the source electrode 5051 or the drain electrode 5052, a composite light-emitting layer 602 arranged on the side of the anode layer 601 away from the flexible base 30, and a cathode layer 603 arranged on the side of the composite light-emitting layer 602 away from the flexible base 30.

The grid electrode in the grid electrode layer 501, the source electrode 5051, the drain electrode 5052 and the active layer 503 constitute a thin film transistor, the thin film transistor being configured to form a pixel driving circuit for driving the light-emitting film 60 to emit light. Illustrated is merely a driving transistor in the pixel driving circuit, the driving transistor being connected to the light-emitting film 60. The drain electrode 5052 of the driving transistor is connected to the corresponding anode layer 601. Under the driving control of the driving film 50, a voltage difference is generated between the anode layer 601 and the cathode layer 603; and holes and electrons are re-composited in the composite light-emitting layer 602, so that the composite light-emitting layer 602 can emit light.

In an embodiment, the encapsulation film 70 covers the driving film 50 and the light-emitting film 60. The touch film 10 is arranged on the side of the encapsulation film 70 away from the flexible base 30.

It should be noted that the touch panel in the embodiments of the present disclosure may be an organic light-emitting diode (OLED) display panel or a micro LED display panel.

Figure 15:
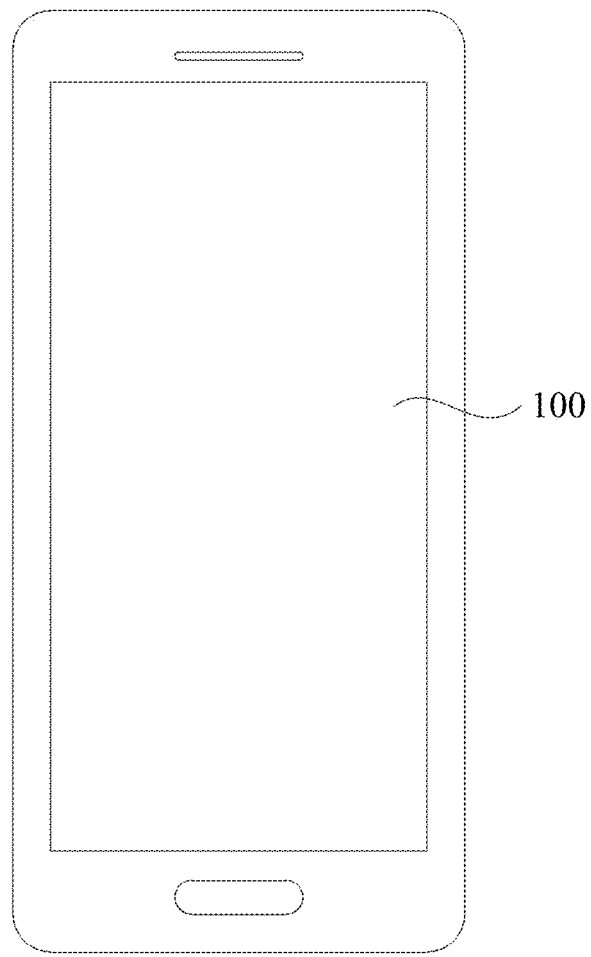
FIG. 15 is a schematically structural view of a touch display device according to an embodiment of the present disclosure.

Referring to FIG. 15, FIG. 15 is a schematically structural view of a touch display device according to an embodiment of the present disclosure. This embodiment of the present disclosure further provides a touch display device including the above touch panel 100.

The specific structure and principle of the touch panel 100 are the same as those of the touch panels described in the above embodiments, and details are not repeated herein. The display device may be any electronic device having a touch display function, such as touch display screen, mobile phone, tablet computer, notebook computer, television and the like.

According to the touch display device provided by the embodiments of the present disclosure, the organic film is arranged between the metal layer and the flexible substrate; and the overpass connection of the touch electrodes is realized through the metal lines in the metal layer. On one hand, as the water drop contact angle of the organic film is less than 80°, the etching effect of the metal lines can be improved compared with the related art in which metal lines are directly prepared on a flexible substrate made of a PI material, so that the breakage resistance of the metal lines is improved, i.e., the breakage probability of the metal lines is reduced, thereby enhancing the touch performance. On the other hand, when the organic material as the film between the flexible substrate and the metal layer is compared with the inorganic material as the film between the flexible substrate and the metal layer in the related art, the organic material is more conducive to the improvement of the breakage resistance of the metal lines. i.e., the breakage probability of the metal lines is further reduced, thereby further enhancing the touch performance.

The preferable embodiments of the present disclosure described above are not intended to limit the claims of the present disclosure. A person skilled in the art can make any possible variations and modifications without departing from the concept of the present disclosure. Therefore, the protection scope of the present disclosure should be based on the scope defined in the claims of the present disclosure.

What is claimed is:

1. A touch film, comprising
    a flexible substrate, wherein a material of the flexible substrate is polyimide;
    a metal layer;
    an organic film arranged between the metal layer and the flexible substrate, wherein a water drop contact angle of the organic film is less than 80°; and
    a touch electrode layer comprising multiple groups of first touch electrodes and multiple groups of second touch electrodes, wherein the multiple groups of first touch electrodes are arrayed in a first direction and extend along a second direction; the multiple groups of second touch electrodes are arrayed in the second direction and extend along the first direction; each group of the first touch electrodes comprises a plurality of first touch electrodes arrayed in the second direction; each group of the second touch electrodes comprises a plurality of second touch electrodes arrayed in the first direction; and in each group of the second touch electrodes, adjacent second touch electrodes are electrically coupled; and wherein the metal layer comprises metal connection lines; adjacent first touch electrodes in each group of the first touch electrodes are electrically connected through the associated metal connection line; and an insulating layer is arranged between the metal connection lines and the second touch electrodes.

2. A touch panel, comprising a flexible display panel and the touch film according to claim 1, wherein the flexible display panel comprises a flexible base and a display film arranged on the flexible base; and the touch film is arranged on a side of the display film away the flexible base.

3. The touch panel according to claim 2, wherein the display film comprises a driving film, a light-emitting film and an encapsulation film, wherein the driving film is electrically coupled with the light-emitting film, and drives the light-emitting film to emit light; the encapsulation film is adapted to encapsulate the driving film and the light-emitting film.

4. The touch panel according to claim 3, wherein the driving film comprises:

a grid electrode layer arranged on the flexible base, a first insulating layer covering the grid electrode layer and the flexible base, an active layer arranged on a side of the first insulating layer away from the grid electrode layer, a second insulating layer covering the active layer, and a source-drain electrode layer arranged on a side of the active layer away from the flexible base, wherein the source-drain electrode layer comprises a source electrode and a drain electrode, the source electrode and the drain electrode being electrically coupled with the active layer.

5. The touch panel according to claim 3, wherein the light-emitting film comprises:

an anode layer electrically coupled with the source electrode or the drain electrode, a composite light-emitting layer arranged on a side of the anode layer away from the flexible base, and a cathode layer arranged on a side of the composite light-emitting layer away from the flexible base.

6. The touch panel according to claim 3, wherein the encapsulation film covers the driving film and the light-emitting film; the touch film is arranged on a side of the encapsulation film away from the flexible base.

7. A touch display device comprising a touch panel according to claim 2.

8. The touch film according to claim 1, wherein the first touch electrodes and the second touch electrodes are made of an indium tin oxide material.

9. The touch film according to claim 1, wherein the material of the organic film is selected from a group consisting of epoxy resin, phenolic resin, acrylic resin and methacrylic resin, and a combination thereof.

10. The touch film according to claim 1, wherein the organic film has a light transmittance greater than 95%.

11. The touch film according to claim 1, wherein in a cross section along a direction perpendicular to the flexible substrate, width of metal grid lines is gradually decreased in a direction away from the flexible substrate.

12. The touch film according to claim 1, wherein the organic film comprises a plurality of connection line disposing portions, an orthogonal projection of each metal connection line on the flexible substrate falling within a region of an orthogonal projection of each connection line disposing portion on the flexible substrate.

* * * * *